United States Patent [19]
Quate

[11] Patent Number: 5,591,490
[45] Date of Patent: Jan. 7, 1997

[54] ACOUSTIC DEPOSITION OF MATERIAL LAYERS

[75] Inventor: Calvin F. Quate, Stanford, Calif.

[73] Assignee: Xerox Corporation, Stamford, Conn.

[21] Appl. No.: 556,672

[22] Filed: Nov. 13, 1995

Related U.S. Application Data

[63] Continuation of Ser. No. 245,922, May 18, 1994, abandoned.

[51] Int. Cl.⁶ .................................................. B01J 19/08
[52] U.S. Cl. .......................... 427/457; 427/461; 427/565; 427/600
[58] Field of Search ................................. 427/457, 461, 427/565, 600; 346/140 R

[56] References Cited

U.S. PATENT DOCUMENTS

| | | | |
|---|---|---|---|
| 3,198,170 | 8/1965 | Onishi et al. | 118/627 |
| 4,290,384 | 9/1981 | Ausschnitt et al. | 118/722 |
| 4,308,547 | 12/1981 | Lovelady et al. | 346/140 R |
| 4,697,195 | 9/1987 | Quate et al. | 346/140 R |
| 4,719,476 | 1/1988 | Elrod et al. | 346/140 R |
| 4,719,480 | 1/1988 | Elrod et al. | 346/140 R |
| 4,748,461 | 5/1988 | Elrod | 346/140 R |
| 4,751,529 | 6/1988 | Elrod et al. | 346/140 R |
| 4,751,530 | 6/1988 | Elrod et al. | 346/140 R |
| 4,751,534 | 6/1988 | Elrod et al. | 346/140 R |
| 4,797,693 | 1/1989 | Quate | 346/140 R |
| 4,845,517 | 7/1989 | Temple et al. | 346/140 R |
| 4,959,674 | 9/1990 | Khri-Yakub et al. | 346/140 R |
| 5,028,937 | 7/1991 | Khuri-Yakub et al. | 346/140 R |
| 5,040,003 | 8/1991 | Willis | 346/157 |
| 5,041,849 | 8/1991 | Quate et al. | 346/140 R |
| 5,087,931 | 2/1992 | Rawson | 346/140 R |
| 5,111,220 | 5/1992 | Hadimioglu et al. | 346/140 R |
| 5,121,141 | 6/1992 | Hadimioglu et al. | 346/140 R |
| 5,122,818 | 6/1992 | Elrod et al. | 346/140 R |
| 5,142,307 | 8/1992 | Elrod et al. | 346/140 R |
| 5,216,451 | 6/1993 | Rawson et al. | 346/140 R |

FOREIGN PATENT DOCUMENTS

| | | |
|---|---|---|
| 9211571 | 11/1984 | Japan . |
| 2185322 | 1/1988 | Japan . |
| 3014848 | 6/1988 | Japan . |
| 3107471 | 7/1991 | Japan . |
| 5282934 | 2/1994 | Japan . |
| 512266 | 10/1971 | Switzerland . |
| WOA8807704 | 10/1988 | WIPO . |
| WOA9011837 | 10/1990 | WIPO . |

OTHER PUBLICATIONS

Elrod, S. A.; Hadimioglu, B.; Khuri–Yakub, B. T.; Rawson, E. G.; Richley, E.; Quate, C. F. Nozzleless Droplet Formation with Focused Acoustic Beams. J. Appl. Phys., vol. 65, No. 9, 1 May 1989. pp. 3441–3447.

*Primary Examiner*—Michael Lusignan
*Assistant Examiner*—David M. Maiorana

[57] ABSTRACT

A method of depositing fluid using acoustic droplet ejectors onto a receptor until the desired layer is formed.

6 Claims, 7 Drawing Sheets

ACOUSTIC DEPOSITION OF MATERIAL LAYERS

This is a continuation of application Ser. No. 08/245,922, filed May 18, 1994, now abandoned.

This invention relates to the deposition of material layers using acoustically ejected droplets.

BACKGROUND OF THE PRESENT INVENTION

Modern fabrication processes frequently require depositions of layers of one or more materials onto a receptor. For example, most semiconductor fabrication processes require that a resist (such as photoresist or electron resist) be deposited on a substrate. Then by using photolithographic techniques, selected areas of the resist layer can be removed and the underlying substrate can be subjected to subsequent processing (such as metal film deposition) to form complex semiconductor devices.

While semiconductor fabrication is an important fabrication process which requires the deposition of material layers, it is certainly not the only one. Other examples include the deposition of molten solder onto printed circuit boards, the deposition of catalysts, such as those used in the production of flex cables, and the deposition of materials, such as hot melt waxes, to create three dimensional structures.

While some fabrication processes, such as creating three dimensional structures, require depositions of materials over controlled areas of a receptor, in other processes, such as semiconductor fabrication, the deposited layer can simply be uniformly formed over the entire surface of the receptor. While forming a uniform layer over the entire surface of a receptor is usually much simpler than depositing a layer over selected areas of a receptor, even the simpler case has its problems. The depositing of resist onto a substrate will illustrate some of those problems.

Resist is usually applied to a substrate using a process called spin coating. A typical spin coating process begins with the placement of a relatively thick layer of liquid resist over the substrate. This may be accomplished by pouring liquid resist on the center of a slowly rotating substrate. As the substrate rotates, the resist spreads over the substrate. After the substrate is fully coated with the resist, the substrate is quickly accelerated, causing excess resist to flow over the substrate toward its edges. Finally, the substrate is rotated at high speed so that droplets of the excess resist are spun off of the substrate, leaving only a thin, even layer of resist. After the resist's solvent sufficiently evaporates, the resist is solid and the spinning stops.

While spin coating is a highly developed process, it has the problem of being wasteful of resist since most of the resist is spun off the substrate. Another problem is the great care that must be taken to prevent the large droplets which are spun off of the substrate from returning to the substrate and disturbing the existing resist layer. A third problem is a result of the chemicals which comprise modern resists. Many of those chemicals are toxic and hazardous to both the health of workers and to the environment. Thus, the less resist used, the better. Additionally, spin coating cannot easily apply layers in selected locations of the substrate. This is a significant drawback since multilevel depositions (which are three dimensional structures) are not easily formed, if at all, using spin coating.

In other applications in which a material is deposited over a wide area, such as in some color filter fabrication techniques, the deposited material is expensive. Techniques which reduce the amount of material that is deposited are beneficial.

As previously mentioned, the difficulty of depositing material layers over selected areas of a receptor are greater then when simply fully coating a surface. For example, one cannot easily use spin coating. Furthermore, once a particular technique of depositing a layer over selected areas of a receptor is developed, any change in the area being covered may be difficult to implement.

Therefore, a new method of depositing one or more material layers onto a receptor, particularly a method capable of saving material and which permits the deposition of material only on selected areas of the receptor, would be beneficial.

SUMMARY OF THE INVENTION

The present invention is a method of depositing material layers by acoustically ejecting droplets of the material onto a receptor until the desired layer is formed. Beneficially, the method relates to acoustic printing.

BRIEF DESCRIPTION OF THE DRAWINGS

Other aspects of the present invention will become apparent as the following description proceeds and upon reference to the drawings, in which.

In the drawings, like numbers designate like elements. Additionally, the subsequent text uses various directional signals which are taken relative to the drawings (such as top and bottom) and which are meant to aid the understanding of the invention, not to limit it.

DETAILED DESCRIPTION OF THE ILLUSTRATED EMBODIMENT

Various printing technologies have been developed for marking recording media. For example, thermal ink jet printing operates by rapidly heating an element to cause ejection of a bubble from a nozzle. Another prior art printing technology is the piezoelectric ink jet. In a piezoelectric ink jet printer, an electric voltage causes a piezoelectric element in a liquid to expand, thereby forcing a droplet from a nozzle. It should be noted that nozzle based printers tend to clog. Another problem with nozzle based printers is the difficulty of obtaining large numbers of very small and accurately placed nozzles at reasonable cost. Because of this, nozzle based printers typically use a relatively small printhead which moves in a raster fashion across a recording medium.

When printing, the primary goal is to deposit a marking fluid over predetermined areas of a recording medium. In contrast, when depositing uniform layers of materials on a receptor, the goal is to deposit a smooth, even layer of material at a predetermined thickness over a receptor.

While there are many other printer technologies, of importance to the present invention is acoustic printing. In acoustic printing, focused acoustic energy ejects droplets from the free surface of a marking fluid onto a recording medium. More detailed descriptions of acoustic droplet ejection and acoustic printing in general are found in the following U.S. Pat. Nos. and in their citations: 4,308,547 by Lovelady et al., entitled "LIQUID DROP EMITTER," issued 29 Dec. 1981; 4,697,195 by Quate et al., entitled "NOZZLELESS LIQUID DROPLET EJECTORS," issued 29 Sep. 1987; 4,719,476 by Elrod et al., entitled "SPATIALLY ADDRESSING CAPILLARY WAVE DROPLET EJECTORS AND THE LIKE," issued 12 Jan. 1988; 4,719,480 by Elrod et al., entitled "SPATIAL STABLIZATION OF STANDING CAPILLARY SURFACE WAVES," issued 12 Jan. 1988; 4,748,461 by Elrod, entitled "CAPILLARY WAVE CONTROLLERS FOR NOZZLELESS. DROPLET EJECTORS," issued 31 May. 1988; 4,751,529 by Elrod et al., entitled "MICROLENSES FOR ACOUSTIC PRINTING," issued 14 Jun. 1988; 4,751,530 by Elrod et al., entitled "ACOUSTIC LENS ARRAYS FOR INK PRINTING," issued 14 Jun. 1988; 4,751,534 by Elrod et al., entitled "PLANARIZED PRINTHEADS FOR ACOUSTIC PRINTING," issued 14 Jun. 1988; 4,959,674 by KhrioYakub et al., entitled "ACOUSTIC INK PRINTHEAD HAVING REFLECTION COATING FOR IMPROVED INK DROP EJECTION CONTROL," issued 25 Sep. 1990; 5,028,937 by Khuri-Yakub et al., entitled "PERFORATED MEMBRANES FOR LIQUID CONTRONLIN ACOUSTIC INK PRINTING," issued 2 Jul. 1991; 5,041,849 by Quate et al., entitled "MULTI-DISCRETE-PHASE FRESNEL ACOUSTIC LENSES AND THEIR APPLICATION TO ACOUSTIC INK PRINTING," issued 20 Aug. 1991; 5,087,931 by Rawson, entitled "PRESSURE-EQUALIZED INK TRANSPORT SYSTEM FOR ACOUSTIC INK PRINTERS," issued 11 Feb. 1992; 5,111,220 by Hadimioglu et al., entitled "FABRICATION OF INTEGRATED ACOUSTIC INK PRINTHEAD WITH LIQUID LEVEL CONTROL AND DEVICE THEREOF," issued 5 May 1992; 5,121,141 by Hadimioglu et al., entitled "ACOUSTIC INK PRINTHEAD WITH INTEGRATED LIQUID LEVEL CONTROL LAYER," issued 9 Jun. 1992; 5,122,818 by Elrod et al., entitled "ACOUSTIC INK PRINTERS HAVING REDUCED FORCUSING SENSITIVITY," issued 16 Jun. 1992; 5,142,307 by Elrod et al., entitled "VARIABLE ORIFICE CAPILLARY WAVE PRINTER," issued 25 Aug. 1992; and 5,216,451 by Rawson et al., entitled "SURFACE RIPPLE WAVE DIFFUSION IN APERTURED FREE INK SURFACE LEVEL CONTROLLERS FOR ACOUSTIC INK PRINTERS," issued 1 Jun. 1993. All of those patents are hereby incorporated by reference.

It is to be noted that acoustic printers do not use nozzles, and are therefore unlikely to clog. Furthermore, acoustic printers can be fabricated using photolithographic techniques to have thousands of densely packed droplet ejectors, each of which ejects very small droplets.

The present inventor has found that acoustic ejection of droplets of a wide variety of materials is possible. He also recognized that the high droplet ejector density and the small droplet sizes possible with acoustic printing technology can produce smooth, controlled layers of various materials on a receptor. Because of the relatively constant droplet dimensions from acoustic droplet ejectors, substantially uniform layers of predetermined thicknesses can be formed.

In contrast, the tendency of nozzle based printing technologies to clog, combined with the relatively low density of droplet ejectors readily achievable, are believed to limit the utility of nozzle based printers for material layer formation.

Figure 1:
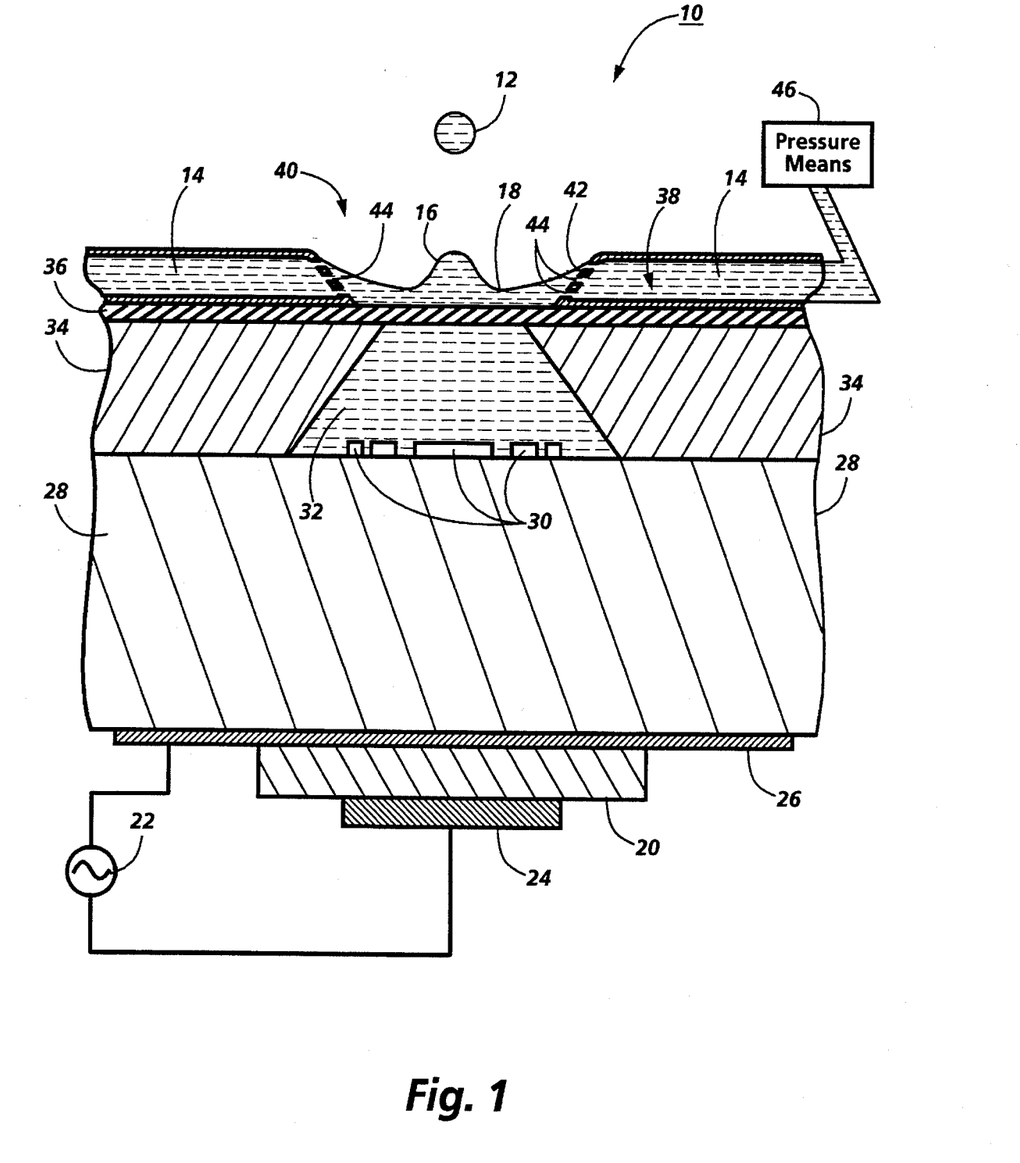
FIG. 1 is an unscaled view of a first embodiment of a single acoustic droplet ejector ejecting a droplet of resist.

The principles of the present invention will become clearer after study of the commercially important embodiment of acoustically depositing a uniform layer of resist upon a substrate. Refer now to FIG. 1 for an illustration of an exemplary acoustic droplet ejector 10. FIG. 1 shows the droplet ejector 10 shortly after ejection of a droplet 12 of resist 14 and before the mound 16 on the free surface 18 of the resist 14 has relaxed.

The forming of the mound 16 and the subsequent ejection of the droplet 12 is the result of pressure exerted by acoustic forces created by a ZnO transducer 20. To generate the acoustic pressure, RF drive energy is applied to the ZnO transducer 20 from an RF driver source 22 via a bottom electrode 24 and a top electrode 26. The acoustic energy from the transducer passes through a base 28 into an acoustic lens 30. The acoustic lens focuses its received acoustic energy into a small focal area which is at, or near, the free surface 18 of the resist 14. Provided the energy of the acoustic beam is sufficient and properly focused relative to the free surface of the resist, a mound 16 is formed and a droplet 12 is subsequently ejected.

Still referring to FIG. 1, the acoustic energy from the acoustic lens 30 passes through a liquid cell 32 filled with a liquid having a relatively low attenuation. The bottom of the liquid cell 32 is formed by the base 28, the sides of the liquid cell are formed by surfaces of an aperture in a top plate 34, and the top of the liquid cell is sealed by an acoustically thin capping structure 36. By "acoustically thin" it is implied that the thickness of the capping structure is less than the wavelength of the applied acoustic energy.

The droplet ejector 10 further includes a reservoir 38, located over the capping structure 36, which holds resist 14. As shown in FIG. 1, the reservoir includes an opening 40 defined by sidewalls 42. It should be noted that the opening 40 is axially aligned with the liquid cell 32. The side walls 42 include a plurality of portholes 44 through which the resist passes. A pressure means 46 forces resist 14 through the portholes 44 so as to create a pool of resist having the free surface 18 over the capping structure 36.

The droplet ejector 10 is dimensioned so that the free surface 18 of the resist is at, or is near, the acoustic focal area. Since the capping structure 36 is acoustically thin, the acoustic energy readily passes through the capping structure and into the overlaying resist.

A droplet ejector similar to the droplet ejector 10, including the acoustically thin capping structure and reservoir, is described in commonly assigned U.S. patent application Ser. No. 07/890,211, filed by Quate et al. on 29 May 1992, now abandoned in favor of U.S. patent application Ser. No.

08/337,913, filed by Quate et al. on 14 Nov. 1994. That patent application is hereby incorporated by reference.

Figure 2:
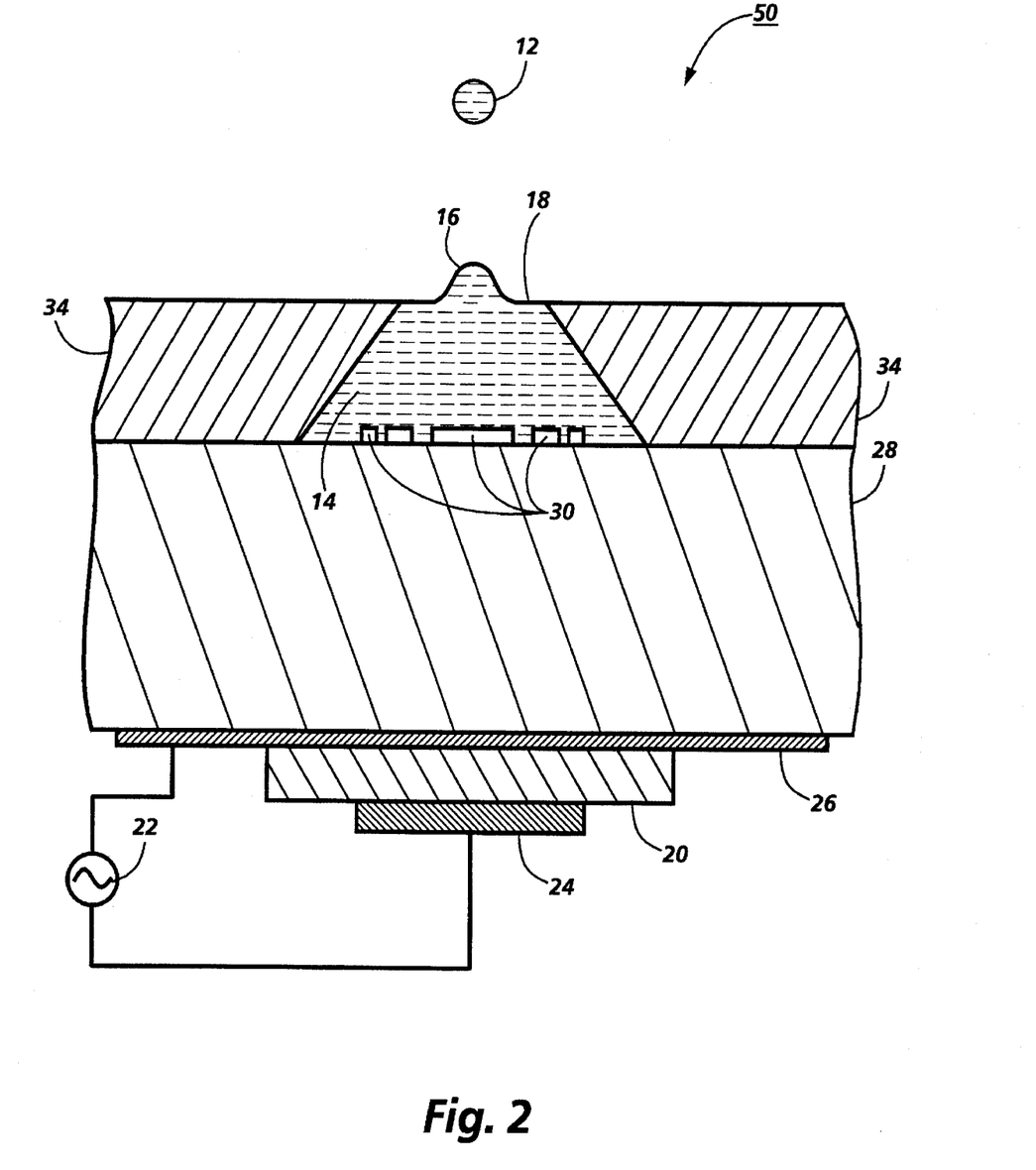
FIG. 2 is an unscaled view of a second embodiment of a single acoustic droplet ejector ejecting a droplet of resist.

A second embodiment acoustic droplet ejector 50 is illustrated in FIG. 2. The droplet ejector 50 does not have a liquid cell 32 sealed by an acoustically thin capping structure 36. Nor does it have the reservoir filled with resist 14 or any of the elements associated with the reservoir (such as the pressure means). Rather, the acoustic energy passes from the acoustic lens 30 directly into resist 14. However, droplets 12 are still ejected from mounds 16 formed on the free surface 18 of the resist.

While the acoustic droplet ejector 50 is conceptually simpler than the acoustic droplet ejector 10, it should be noted that the longer path length through the resist of the acoustic droplet ejector 50 might result in excessive acoustic attenuation and require larger acoustic power for droplet ejection.

As with other acoustic droplet ejectors, droplet ejectors which form deposition layers can be reproduced many, perhaps thousands, of times using photolithographic techniques.

Figure 3:
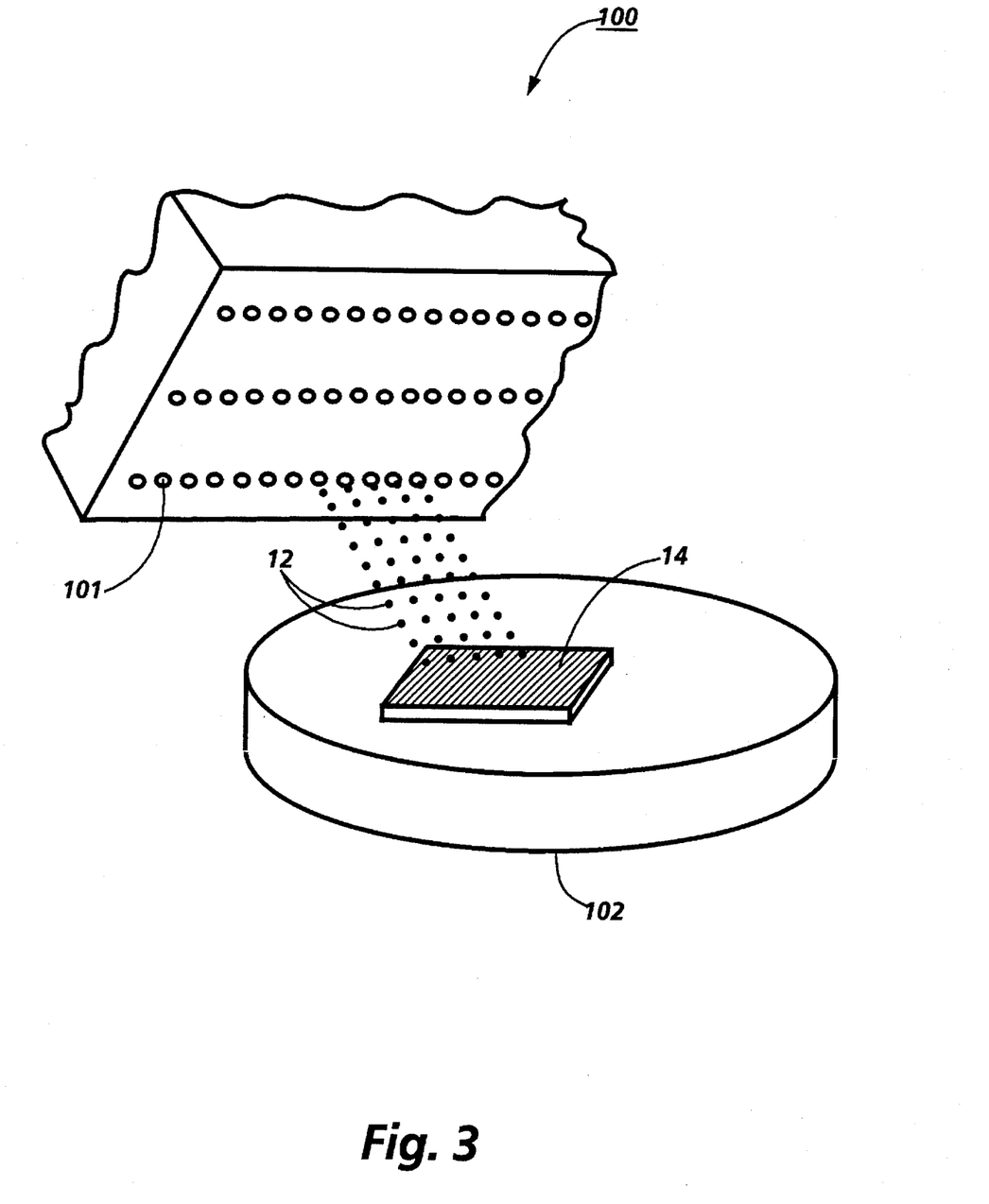
FIG. 3 is an unscaled view of an array of acoustic droplet ejectors, each according to FIGS. 1 or 2, depositing resist onto a substrate in a controlled fashion so as to form a layer in a predetermined pattern.

FIG. 3 shows an array 100 of individual droplet ejectors 101, of which five are ejecting droplets 12 of resist 14 onto a substrate 102. FIG. 3 illustrates an interesting application of acoustic deposition of materials: patterning. As in acoustic printing, individual ones or groups of droplet ejectors can be controlled so as to deposit predetermined patterned layers on a receptor.

Figure 4:
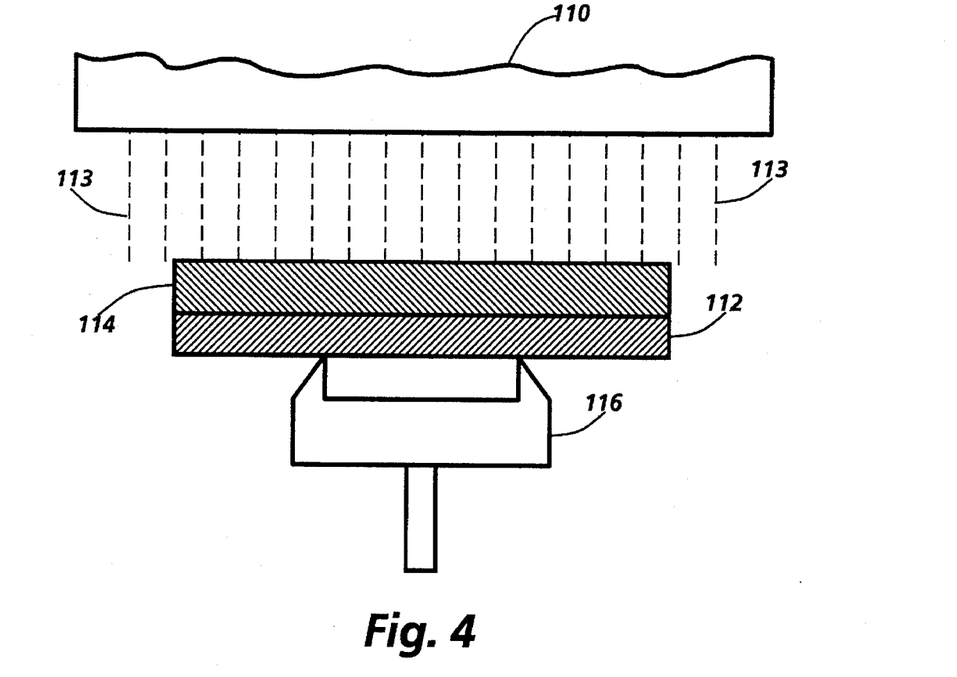
FIG. 4 is an unscaled view of an array of acoustic droplet ejectors ejecting resist onto a substrate.

While ejection from an array of individual droplet ejectors could be controlled as illustrated in FIG. 3 (and as in acoustic printing) to create an "image" of resist on a substrate, in semiconductor fabrication this is not necessarily desirable. For example, FIG. 4 shows an array 110 which overlaps a substrate 112 such that if all droplet ejectors eject droplets 113, a smooth, even coating of resist 114 is produced.

Figure 5:
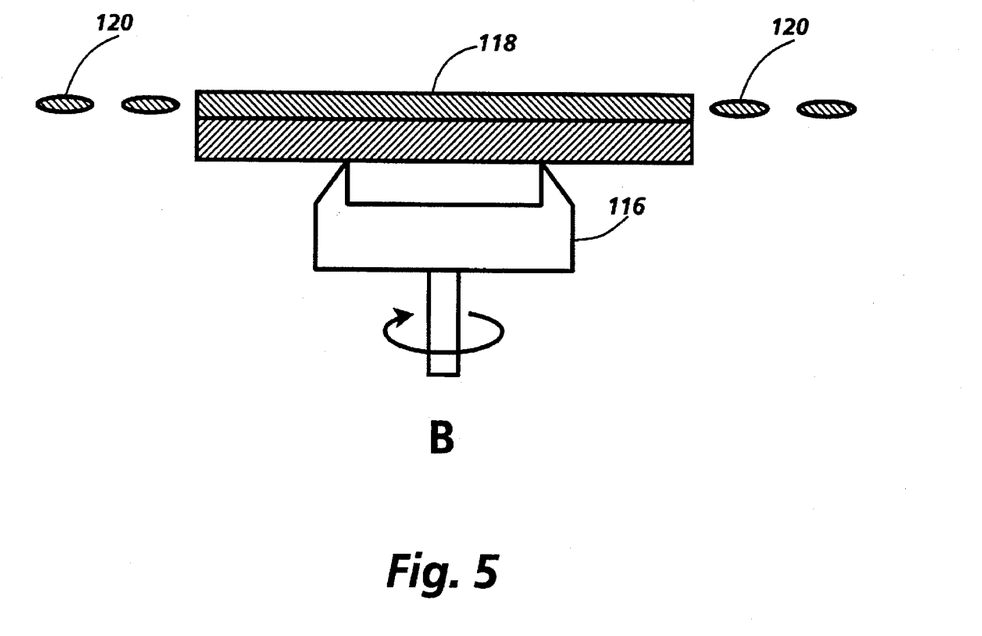
FIG. 5 is an unscaled view of the resist and substrate in FIG. 4 being spun to produce a thin, uniform coating of resist.

In some fabrication applications, the resist layer may be made sufficiently thin and well controlled that subsequent spin coating is not required. However, as shown in FIGS. 4 and 5, the substrate 112 can be attached to a rotating mount 116 If required, after deposition of the resist layer (as illustrated in FIG. 4), the rotating mount 116 can be spun as shown in FIG. 5 to produce a spin coated resist layer 118 from the resist 114. During spinning, small droplets 120 of excess resist are spun off. The advantage of the spin coating method illustrated in FIGS. 4 and 5 over the prior art is that, when using the principles of the present invention, the initial resist deposition can be made smooth and thin prior to spinning. This reduces the material waste, and consequently reduces the safety and environmental concerns over the prior art spin coating process. Additionally, if the initially deposited resist layer is thin, much smaller resist droplets are spun off the substrate, and thus less effort need be expended to prevent the spun off droplets from returning to the substrate.

The individual acoustic droplet ejectors described with reference to FIGS. 1 and 2, and their applications with regards to FIGS. 4 and 5, have been described as "ejecting" droplets. It is to be understood that droplet ejection as used herein refers to the forcing of droplets from the surface of a material. In other contexts, such as acoustic ink printing, droplet ejection frequently refers to causing a droplet to leave the surface of a material in such a way that the droplet travels along a particular path. The difference being that in some material deposition applications, such as resist depositions as described in relation to FIG. 5, the paths taken by the droplets are largely immaterial. For example, by driving the transducers of an array of acoustic droplet ejectors with high intensity, but short duration RF pulses, mists are created which can be used to form material layers on substrates. See, Elrod et al., "Nozzleless droplet formation with focused acoustic beams," particularly pp. 3444, "VI. Pulse width: ejection stability and droplet diameter," J. Appl. Phys. Vol. 65, 1 May 1989.

Figure 6:
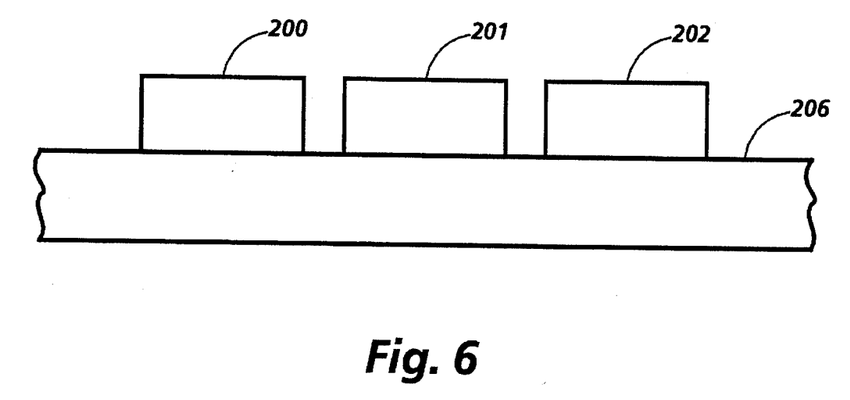
FIG. 6 is an unscaled, cut-away view of polyimide deposited on a glass substrate.

It is to be understood that the use of the present invention extends well beyond depositing resist on a substrate. For example, FIG. 6 shows a cross-sectional view of three sections, the sections 200 through 202, of polyimide deposited on a glass receptor 206. Each of the sections is a different color, such as red, blue, or green, and could be used as a color filter.

Figure 7:
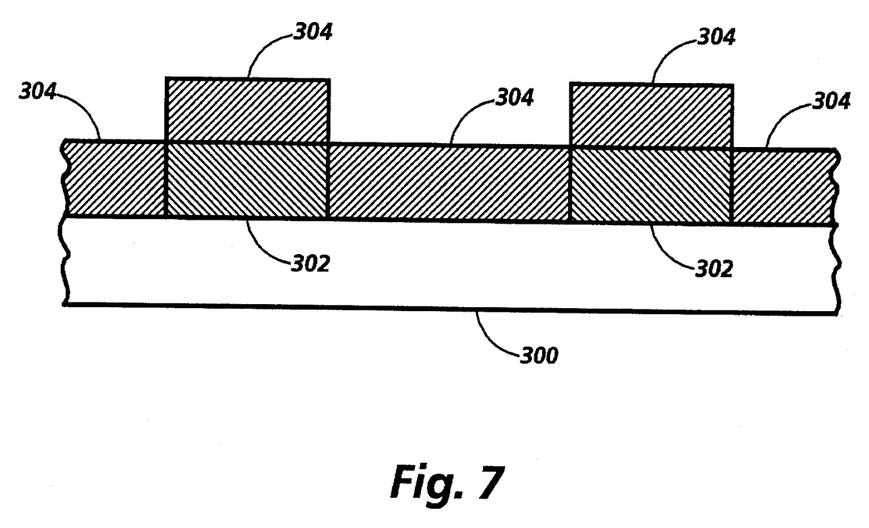
FIG. 7 is an unscaled, cut-away view of a three layer structure formed using the principles of the present invention.

The present invention can also be used to create three dimensional structures. For example, FIG. 7 shows a printed circuit board 300 having a plurality of copper traces 302. Over the copper trace is deposited a protective urethane coating 304 which protects the copper traces 302.

Figure 8:
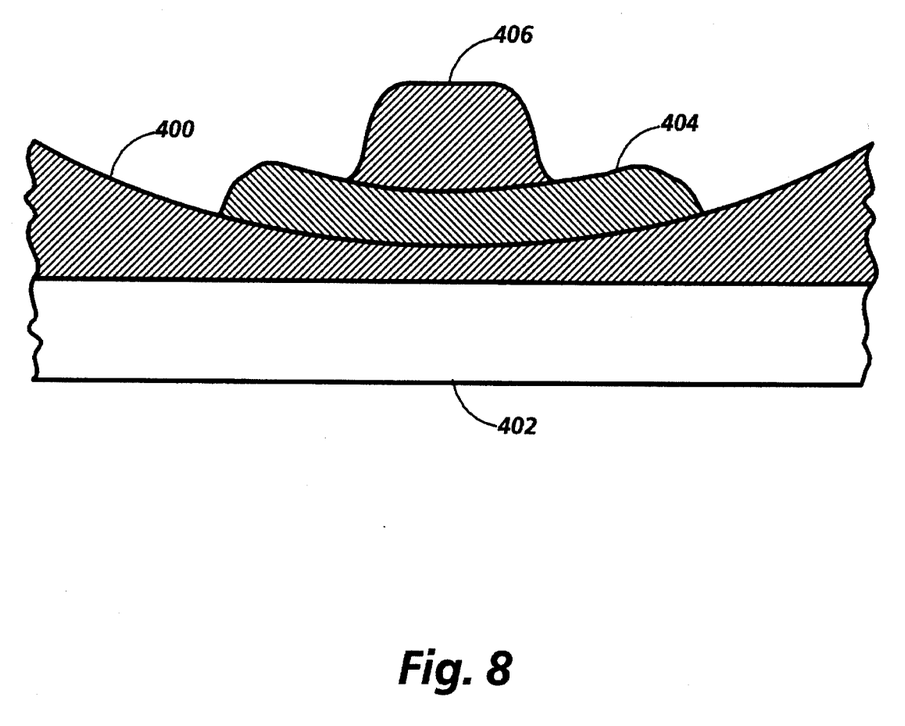
FIG. 8 is an unscaled, cut-away view of a complex three layer structure formed using the principles of the present invention.

FIG. 8 shows an even more complex three dimensional structure which is formed by repeated depositions. First, a variable thickness first metallic layer 400, say of solder, is deposited onto a substrate 402. Note that, as shown in FIG. 8, the principles of the present invention can be applied to create layers of nonconstant thickness. FIG. 8 also shows a polymer layer 404 which is selectively deposited over the first metallic layer 400. On top of the polymer layer 404 is deposited a second metallic layer 406, say again of solder. Of course, in other embodiments the various layers 400, 404, and 406 may be of the same material. Essentially, the principles of the present invention can be applied to create three dimensional structures using a wide range of materials.

The acoustic droplet ejectors illustrated in FIGS. 1 and 2 are believed to be useful for a wide range of materials and droplet sizes. However, at relatively low acoustic frequency (say 50 MHz), ZnO acoustic transducers become difficult to implement. Transducers made of alternative materials, such as lithium niobate ($LiNbO_3$) or a piezoelectric polymer such as $PVF_2$, or PZT, are then beneficial. Further, while the droplet ejectors depicted in FIGS. 1 and 2 pass the acoustic energy from the transducer through the base, this is not required. An alternative droplet ejector 498 which uses $LiNbO_3$ transducers and which does not pass the acoustic energy through a base is described below with the assistance of FIGS. 9 and 10.

Figure 9:
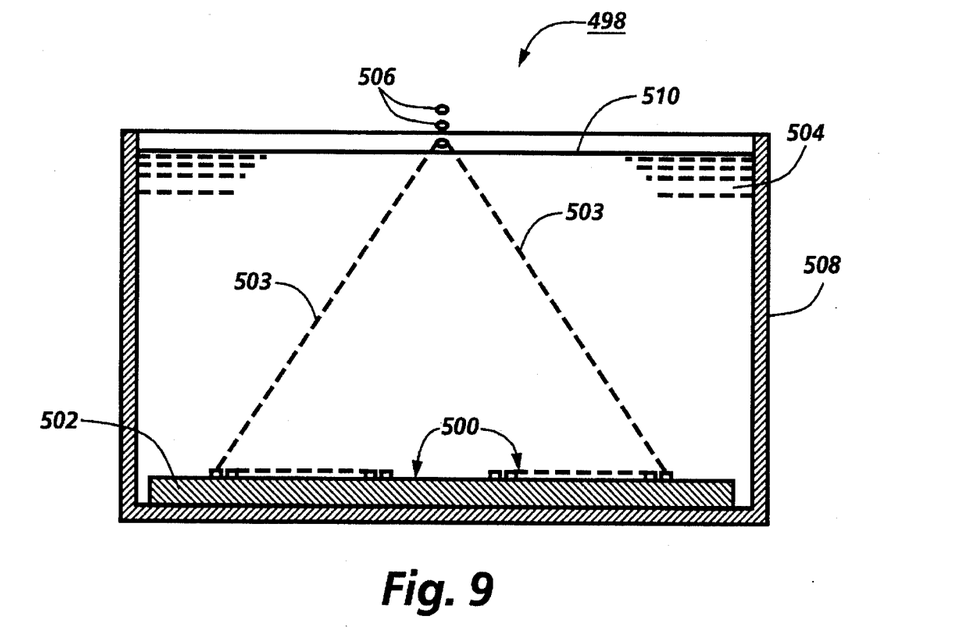
FIG. 9 is a schematic depiction of an alternative embodiment droplet ejector.

In FIG. 9, a planar surface acoustic transducer 500 which includes a piezoelectric plate 502 of $LiNbO_3$ launches focused acoustic energy in a cone 503 through a material 504 that is to be ejected as droplets 506. The material 504 is held within a container 508 such that the free surface 510 of the material is at or is near the focus area of the acoustic energy. When the acoustic transducer emits acoustic energy, that energy emits droplets from the free surface.

Figure 10:
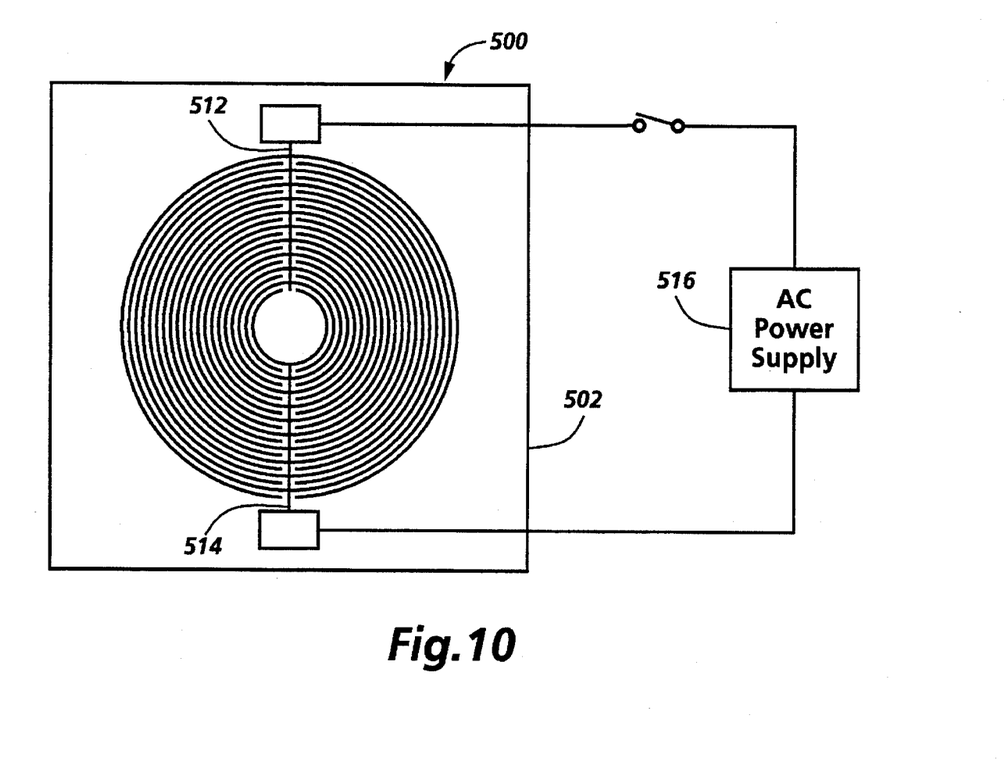
FIG. 10 is a top down view of the transducer/focusing element of the acoustic droplet ejector of FIG. 9.

Referring now to FIG. 10, the acoustic transducer 500 is comprised of the piezoelectric plate 502 and a pair of mulit-element, ring-shaped electrodes, the electrodes 512 and 514, which are generally concentrically deposited in an interdigitated relationship on the upper surface of the piezoelectric plate.

When an AC power supply 516 applies power to the electrodes 512 and 514, radially propagating, coherent Rayleigh waves are piezoelectrically generated on the surface of the piezoelectric plate 502. Due to the incompressibility of the material 504 and the relatively low velocity of sound through the piezoelectric plate, the surface waves cause a generally circular pattern of coherent longitudinal acoustic energy to leak into the material 504 at predetermined acute angles with respect to the surface of the plate: i.e., the longitudinal acoustic energy is focused. Such ejectors are described in more detail in U.S. Pat. No. 4,697,195 by Quate et al., entitled "NOZZLELESS LIQUID DROPLET EJECTORS," issued 29 Sep. 1987.

From the foregoing, numerous modifications and variations of the principles of the present invention will be obvious to those skilled in its art. Therefore the scope of the present invention is to be defined by the appended claims.

What is claimed:

1. A method for coating a substrate comprising the steps of providing a pool of a liquid having a free surface, generating ultrasonic acoustic waves with at least one ultrasonic transducer, focusing the generated ultrasonic acoustic waves to converge near the free surface of the pool of the liquid to eject liquid droplets using a plurality of acoustic lenses positioned adjacent to the at least one ultrasonic transducer, and depositing the ejected liquid droplets onto the substrate to coat the substrate.

2. The method of claim 1, wherein the liquid is a polymer capable of hardening to form a polymer coat of a defined thickness on the substrate.

3. The method of claim 1, wherein the liquid is a resist capable of hardening to form a resist coat of a defined thickness on the substrate.

4. A method for coating of a substrate comprising the steps of providing separated pools of a first liquid and a second liquid, generating ultrasonic acoustic waves with at least one ultrasonic transducer under each of the separated pools of the first liquid and the second liquid, focusing the generated ultrasonic acoustic waves to converge near a free surface of each of the first liquid and the second liquid to respectively eject first and second liquid droplets using a plurality of acoustic lenses positioned adjacent to the at least one ultrasonic transducer, and depositing the ejected first and second liquid droplets onto the substrate to coat the substrate.

5. The method of claim 4, further comprising the step of successively depositing the ejected first and second liquid droplets onto the substrate to form a multilayer coating.

6. A method for coating a substrate comprising the steps of providing a pool of a liquid having a free surface, positioning a substrate in opposed relation to the pool of liquid, generating ultrasonic acoustic waves with an array of ultrasonic transducers, focusing the generated ultrasonic acoustic waves to converge near the free surface of the pool of the liquid to eject liquid droplets using an array of acoustic lenses, with each acoustic lens positioned over each ultrasonic transducer, and directly depositing a coating of the ejected liquid droplets onto the substrate in opposed relation to the pool of liquid.

* * * * *